United States Patent [19]

Kokubu et al.

[11] 4,405,722

[45] Sep. 20, 1983

[54] SEALING GLASS COMPOSITIONS

[75] Inventors: Yoshinori Kokubu, Tokyo; Jiro Chiba; Nobuyoshi Ichimura, both of Yokohama; Takashi Iwai, Yachiyo; Toshiyasu Kawaguchi, Yokohama, all of Japan

[73] Assignees: Asahi Glass Company Ltd.; Iwaki Glass Company Ltd., both of Tokyo, Japan

[21] Appl. No.: 109,079

[22] Filed: Jan. 2, 1980

[30] Foreign Application Priority Data

Jan. 23, 1979 [JP] Japan .................................. 54-5542
Nov. 9, 1979 [JP] Japan .................................. 54-144428

[51] Int. Cl.$^3$ .............................................. C03C 3/12
[52] U.S. Cl. ...................................... 501/15; 501/32; 501/76
[58] Field of Search .................... 106/47 R, 53, 39.6; 501/15, 32, 76

[56] References Cited

U.S. PATENT DOCUMENTS

| | | | |
|---|---|---|---|
| 3,951,669 | 4/1976 | Malmendier et al. | 106/47 R |
| 4,006,028 | 2/1977 | Nofziger | 106/53 |
| 4,115,132 | 9/1978 | Suzuki et al. | 106/73.3 |
| 4,133,690 | 1/1979 | Muller | 106/53 |
| 4,186,023 | 1/1980 | Dumesnil et al. | 106/47 R |

OTHER PUBLICATIONS

Forbes; "Solder Glass Seals in Semi-Conductor Packaging", *Glass Technology*, 8, 32 (1967) pp. 32-42.

*Primary Examiner*—Mark Bell
*Attorney, Agent, or Firm*—Oblon, Fisher, Spivak, McClelland & Maier

[57] ABSTRACT

A sealing glass composition containing refractory filler of lower coefficient of thermal expansion for use in sealing alumina package for electronic components is disclosed. The composition consists essentially of low melting glass powder and cordierite powder in proportion of 2–30% by weight of the total composition, and optionally, $\beta$-eucryptite, $\beta$-spodumen, lead titanate or zircon in a proportion, respectively, not exceeding 15% by weight of the total composition. The low melting glass has a composition of 77.0–86.0 wt. % of PbO, 6.0–15.0 wt. % of $B_2O_3$, 0.5–6.9 wt. % of ZnO, 0.1–3.0 wt. % of $SiO_2$, 0–3.0% of $Al_2O_3$ 0–2.0% of alkali earth metal oxide, 0–1.5% of $SnO_2$ and 0–1.0% of alkali metal oxide.

9 Claims, No Drawings

SEALING GLASS COMPOSITIONS

BACKGROUND OF THE INVENTION

1. Field of the Invention

The present invention relates a sealing glass composition. More particularly, it relates to a sealing glass composition which contains a low-melting glass powder and a refractory filler powder of lower coefficient of thermal expansion which achieves a seal at a non-devitrified state by a heat-treatment at a relatively lower temperature and can be used for a seal of an alumina package in which electronic components such as semiconductor IC (integrated circuit) are enclosed.

2. Description of the Prior Arts

Heretofore, $PbO-B_2O_3-ZnO-SiO_2$ devitrifiable low melting solder glasses (frits) have been used in a seal of an alumina package for IC, and they form a seal portion being compatible with the thermal expansion coefficient of alumina by devitrifying it after vitrifying (flow) it by a heat-treatment at about 480° C. Such conventional solder glasses have disadvantages that the heat-treatment at relatively high temperature is required and permissible ranges of conditions of the heat-treatment for the devitrification such as a temperature and a time for the treatment are narrow.

SUMMARY OF THE INVENTION

It is an object of the present invention to provide a sealing glass composition which can achieve a hermetic seal of alumina with satisfactory flow by a heat-treatment at 400° to 430° C. for shorter than 10 min. and forms a sealed portion having the thermal expansion coefficient which is compatible with the alumina and satisfied desired characteristics such as thermal stress resistance, corrosion resistance to water or acids, electric resistivity and dielectric constant.

The foregoing and other objects of the present invention have been attained by incorporating at least 2 wt. % of cordierite powder as a lower thermal expansion refractory filler into a $PbO-B_2O_3-ZnO-SiO_2$ low melting glass powder having specific contents of.

The sealing glass composition of the present invention consists essentially of a low melting non-devitrifiable glass comprising PbO, $B_2O_3$, ZnO and $SiO_2$ as essential components and a refractory filler powder of low coefficient of thermal expansion, wherein the low melting glass has a composition consisting essentially of by weight %:

| PbO | 77.0–86.0% |
| --- | --- |
| $B_2O_3$ | 6.0–15.0% |
| ZnO | 0.5–6.9% |
| $SiO_2$ | 0.1–3.0% |
| $Al_2O_3$ | 0–3.0% |
| MgO, CaO, BaO, SrO | 0–2.0% |
| $SnO_2$ | 0–1.5% |
| $Li_2O$, $Na_2O$, $K_2O$ | 0–1.0% | and the refractory filler comprises cordierite in a proportion of 2 to 30% by weight of the total composition and optionally, β-eucryptite, β-spodumene, lead titanate or zircon in a proportion respectively not exceeding 15% by weight of the total composition.

DETAILED DESCRIPTION OF THE PREFERRED EMBODIMENTS

The reason of the definition of the composition of the low melting glass as the main component of the sealing glass composition will be described.

When a content of PbO is less than 77% by weight, the softening point of the glass is too high to be suitable for a sealing operation at low temperature. When a content of PbO is more than 86% by weight, the thermal expansion coefficient of the glass is too high.

When a content of $B_2O_3$ is less than 6% by weight, the devitrification is caused in the glass melting operation to adversely affect to the operation. When a content of $B_2O_3$ is more than 15% by weight, a softening point of the glass is too high.

When a content of ZnO is less than 0.5% by weight, the devitrification can hardly occur but the softening point of the glass is too high. When a content of ZnO is more than 6.9% by weight, the devitrification rate of the glass is too high and the devitrification is caused during the glass melting operation.

$SiO_2$ is incorporated so as to control a tendency of the devitrification. When a content of $SiO_2$ is less than 0.1% by weight, the devitrification of glass is caused at high devitrification rate whereby the glass is not satisfactorily flowed in the heat-treatment for the seal. When a content is more than 3% by weight, the softening point of the glass is too high.

It is possible to incorporate $Al_2O_3$ in a proportion of upto 3% by weight, $SnO_2$ in a proportion of upto 1.5% by weight and/or an alkaline earth metal oxide selected from the group consisting of BaO, SrO, CaO and MgO in a proportion of upto 2.0% by weight together with $SiO_2$ so as to control a tendency of the devitrification of the glass.

It is also possible to incorporate an alkali metal oxide selected from the group consisting of $Li_2O$, $Na_2O$ and $K_2O$ in a proportion of upto 1% by weight so as to lower a softening point and to control the condition for the heat-treatment in the sealing treatment.

One of the optimum glass compositions has high content of $SiO_2$ and has following ranges of the essential components by weight %:

| PbO | 80.0–85.0% |
| --- | --- |
| $B_2O_3$ | 7.0–13.0% |
| ZnO | 2.5–6.5% |
| $SiO_2$ | 0.5–2.5% |

The other one of the optimum glass compositions has lower softening point and has following ranges of the essential components by weight %:

| PbO | 83.5–85.5% |
| --- | --- |
| $B_2O_3$ | 10.0–14.0% |
| ZnO | 1.5–3.0% |
| $SiO_2$ | 0.35–0.5% |

The latter type glass has a content of $SiO_2$ in a proportion of upto 0.5% by weight and the softening point (the temperature at which the viscosity of the glass is $10^{7.65}$ poise), of the glass is about 3° to 7° C. lower than the softening point of the former type glass whereby the sealing operation at lower temperature can be performed by using glass composition incorporating the latter type glass.

The glass having said composition satisfactorily flows by the heat-treatment at low temperature such as 400° to 430° C. for 10 minutes to achieve hermetic seal in non-devitrified state. However, the thermal expansion coefficient of the glass is relatively high such as 110 to $130 \times 10^{-7}$ °C.$^{-1}$ (50°–350° C.) and accordingly, it can not achieve a matched seal to the alumina or like which has a thermal expansion coefficient of 65 to $70 \times 10^{-7}$ °C.$^{-1}$ (25°–400° C.).

The sealing glass composition of the present invention incorporates cordierite as a low expansion coefficient refractory additive i.e. a filler, in a proportion of 2 to 30% by weight of the glass powder. When a content of the cordierite is less than 2% by weight, the effect of the addition is not enough. When it is more than 30% by weight, the flow characteristic of the sealing glass composition is disadvantageously too low. The optimum content of the cordierite is in a range of 3 to 25% by weight.

The cordierite (2 Mg.2Al$_2$O$_3$.5SiO$_2$) is available as a natural mineral. However, the cordierite synthesized by melting is usually used. The raw materials of MgO, Al$_2$O$_3$ and SiO$_2$ are stoichiometrically mixed and melted to vitrify the mixture at 1500° C. or higher temperature and quenched and pulverized and then, devitrified by heating it at 1350° C.

The cordierite has the thermal expansion coefficient of 10 to $20 \times 10^{-7}$ °C.$^{-1}$ (50°–350° C.) and has the optimum characteristics of corrosion resistance to acids and electric characteristic required for a seal of the alumina package for IC in comparison with the other known fillers. From said viewpoints, the incorporation of only the cordierite is preferable. However, it is possible to add the other filler such as β-eucryptite, β-spodumene, lead titanate or zircon respectively in a proportion of upto 15% by weight of the filler.

The eucryptite (Li$_2$O.Al$_2$O$_3$.4SiO$_2$) and the β-spodumene (LiO$_2$.Al$_2$O$_3$.4SiO$_2$) can be obtained as follows. The raw materials are stoichiometrically mixed and melted to vitrify the mixture at about 1500° C. and quenched and pulverized and then heating it at 900° C.

The zircon (ZrO$_2$.SiO$_2$) is available as a natural product. It is possible to use zircon synthesized by a solid phase reaction of ZrO$_2$ powder and SiO$_2$ powder.

The lead titanate (PbO.TiO$_2$) can be obtained as follows. A mixture of PbO powder and TiO$_2$ powder at equimolar ratio is sintered at 1000°–1200° C. to synthesize it by the solid phase reaction and the sintered product obtained by the reaction is pulverized.

The thermal expansion coefficients of these fillers are as follows.

| | | |
|---|---|---|
| β-eucryptite | $-60$ to $-80 \times 10^{-7}$ °C.$^{-1}$ | (50–350° C.) |
| β-spodumene | 8 to $15 \times 10^{-7}$ °C.$^{-1}$ | (50–350° C.) |
| Zircon | 42 to $48 \times 10^{-7}$ °C.$^{-1}$ | (50–350° C.) |
| Lead titanate | $-40$ to $-53 \times 10^{-7}$ °C.$^{-1}$ | (50–350° C.) |

One embodiment of the process for preparing the sealing glass composition of the present invention is as follows.

The raw materials for the components such as red lead, boric acid, zinc oxide and silica are weighed depending upon the object composition and mixed to make a batch. The batch is charged into a platinum crucible and is melted in an electric furnace at 1000° to 1250° C. for 1 to 2 hours. The molten glass is crushed by pouring into water or is formed into a plate form and crushed by a ball mill to give an average diameter of about 1 to 8μ. The filler can be incorporated by charging the filler at a desired ratio into the ball mill in the crushing operation so as to simultaneously crush them or by mixing fine filler having an average diameter of about 1 to 8μ with the glass powder in a mixer.

The sealing glass composition of the present invention is used for a seal of an alumina package at mainly non-devitrified state. However, it can be used at a devitrified state by an adjustment of the components in the glass, for a seal of a soda-lime glass such as a float glass plate or a metal.

When the sealing glass composition is used for the seal of the alumina package in which IC is enclosed, the sealing glass composition should have the following characteristics.

Transformation point (Tg °C.); Softening points (Ts, °C.)

The transformation point (Tg) is defined to be the temperature for initiation of an abnormal expansion of a glass in a linear expansion curve of a rod glass. It corresponds to a viscosity of the glass of $\eta = 10^{13} - 10^4$ poise.

The softening point (Ts) is defined to be the temperature for the viscosity of the glass of $\eta = 10^{7.65}$ poise (log. $\eta = 7.65$).

From the practical viewpoint, the softening and flow of the glass are initiated at the transformation temperature and the sufficient flow of the glass occurs at near the softening point.

The transformation point and the softening point of the glass are usually measured by DTA thermogram.

In the sealing glass, Tg and Ts in the case of said high SiO$_2$ content glass are in the following ranges.
Tg: 290° to 315° C.
Ts: 335° to 360° C.
and Tg and Ts in the case of said low SiO$_2$ content glass are in the following ranges.
Tg: 285° to 310° C.
Ts: 335° to 350° C.

Flow characteristic (diameter of flow button: cm)

The sealing glass composition should soften and flow to wet satisfactorily the surface for the part to be sealed and to maintain the hermetic seal.

In the measurement of the flow characteristic, a powdery sample is weighed at grams corresponding to its specific gravity and is press-molded in a cylindrical form having a diameter of 12.5 mm and the molded sample is heated under the conditions of the heat-treatment shown in Table and the flow button diameter is measured.

When the sealing glass composition is used for the seal of the alumina package for IC, the measured flow button diameter should be at least 17 mm preferably in a range of 18 to 20 mm.

Volume resistivity P (ohm.cm)

The volume resistivity is an indication of the electric insulation. The volume resistivity of the composition after the heat-treatment should be at least $10^{10}$ ohm.cm at 150° C.

Dielectric constant ε

The dielectric constant relates to an energy accumulated in the sealing glass composition as the dielectric material between the leads. The dielectric constant of the heat-treated composition at 20° C. in a frequency of 1 MHz is preferably less than 20.

Thermal expansion coefficient α (cm$^{-1}$)

The α-alumina for the IC package usually has the thermal expansion coefficient of 65 to 70×10$^{-7}$ C.$^{-1}$ (25°-400° C.).

The sealing glass composition of the present invention should be converted into a sealed material having the thermal expansion coefficient of ±2×10$^{-7}$ to −10×10$^{-7}$ C.$^{-1}$ to that of the alumina (i.e. 55 to 72×10$^{-7}$ C.$^{-1}$) so as to achieve the matched seal.

Corrosion resistance to acids

The alumina package is plated with tin after enclosing IC so as to improve durability of lead wires. In the plating operation, the package is dipped into an acid to remove a scale and then, dipped into an acid plating bath in order to improve the productivity.

In the acid dipping operation, the outer surface of the sealed portion made of the glass and the filter is corroded. When the corrosion is too high, pits are formed and the plating bath remains in the pits even after washing, whereby a trouble of electric leakage may cause. Therefore, the corrosion resistance to acids as the corrosion resistance to plating bath is important when the sealing glass composition is used for the IC package.

The corrosion resistance is measured by dipping a plate sample which has been heat-treated at 400° to 430° C. for 10 minutes (25×40×3 mm) in 5 wt. % of nitric acid or 20 wt. % of acetic acid at 25° C. for 10 minutes and weighing a weight loss per unit area (mg/cm$^2$). This should be less than 100 mg/cm$^2$ preferably less than 80 mg/cm$^2$. The present invention will be further illustrated by certain examples and references which are provided for purposes of illustration only and are not intended to be limiting the present invention.

EXAMPLES

Each glass of Example No. 1 to 18 was prepared by using the compositions shown in the upper part of Table 1. In the crushing step of the glass, each filler shown in the lower part of Table 1 was added at the specified ratio to prepare each powdery sample for the tests. The content of the glass powder in the sample is calculated by subtracting the content of the filler from 100%. In Example No. 17 and No. 18, which are references, no cordierite was incorporated.

The characteristic values of the samples were measured and shown in Table 2.

Glass transformation point (Tg(°C.)); Softening point (Ts(°C.))

1.0 g. of each powdery sample was charged into a holder of a differential thermal analyzer and the temperature was elevated at a rate of 10° C./min. to draw each DTA thermogram. The initial endothermic point on the thermogram is shown as the transformation point (°C.) and the second initial endothermic point is shown as the softening point (°C.) in Table.

Thermal expansion coefficient: α(10$^{-7}$ C.$^{-1}$)

Each powdery sample was press-molded and heated in each condition of the heat-treatment shown in Table (400°-430° C.: 10 min.) to obtain a rod sample. Each thermal expansion coefficient between 50° C. and the transformation point of the glass was measured.

Flow characteristic (diameter of button: mm)

Each sample was heated in the condition of the heat-treatment shown in Table by the above-mentioned method and each diameter of each flow button was measured.

Volume resistivity P(ohm.cm)

Each volume resistivity of each heat-treated sample P(ohm.cm) was measured at 150° C. The common logarithums of the data (log P) are shown in Table.

Dielectric constant

Each dielectric constant (ε) of each heat-treated sample at 20° C. in 1 MHz was measured.

Corrosion resistance to acids

Each sample was respectively dipped into 5% HNO$_3$ and 25% CH$_3$COOH by the above-mentioned method and each weight loss mg/cm$^2$ was measured.

TABLE 1

| Example No. | 1 | 2 | 3 | 4 | 5 | 6 | 7 | 8 | 9 | 10 | 11 | 12 | 13 | 14 | 15 | 16 | 17* | 18* |
|---|---|---|---|---|---|---|---|---|---|---|---|---|---|---|---|---|---|---|
| Composition of glass (wt %) | | | | | | | | | | | | | | | | | | |
| PbO | 79 | 80 | 80 | 81 | 82 | 83 | 84 | 84 | 85 | 84.65 | 84.45 | 84 | 85 | 84.0 | 84.5 | 82.0 | 84.5 | 84.5 |
| B$_2$O$_3$ | 11.5 | 12 | 12 | 10 | 11.5 | 9 | 8.5 | 11 | 10.5 | 12.0 | 12.1 | 8.5 | 12 | 11.5 | 11.5 | 12.5 | 12 | 12 |
| ZnO | 6.5 | 5.0 | 5.5 | 6.5 | 5.5 | 6.0 | 5.5 | 3.0 | 2.5 | 2.4 | 2.7 | 4.5 | 2 | 3.5 | 3.0 | 4.5 | 2.4 | 2.4 |
| SiO$_2$ | 1.5 | 1.7 | 1.5 | 2.0 | 1.0 | 0.5 | 0.8 | 1.0 | 2 | 0.45 | 0.35 | 1.6 | 0.5 | 0.5 | 0.5 | 0.5 | 1.0 | 1.0 |
| Al$_2$O$_3$ | 0.5 | 1.0 | | | 1.0 | 1.2 | 1.0 | | | | | 0.5 | 0.4 | | 0.5 | | | |
| SnO$_2$ | 0.5 | 0.3 | 0.5 | | | 0.5 | | | | 0.5 | 0.3 | 0.4 | | 0.4 | | 0.5 | 0.1 | 0.1 |
| RO | MgO 0.5 | | CaO 0.3 | BaO 0.5 | | | | | | | MgO 0.1 | SrO 0.5 | | | | | | |
| R$_2$O | | | Li$_2$O 0.2 | | | | Li$_2$O 0.2 | | | | | | | Na$_2$O 0.1 | K$_2$O 0.1 | | | |
| Content of filler (wt %) | | | | | | | | | | | | | | | | | | |
| Cordierite | 13 | 15 | 14 | 8 | 18 | 17 | 15 | 10 | 17 | 14.5 | 14.5 | 15.0 | 16.0 | 10.0 | 13.0 | 10.0 | | |
| β-eucryptite | 2 | | | | | | | | | | | | | | | | | 14.5 |
| β-spodumene | | | | | | | | | | | | | | 6.0 | | 2.0 | 14.5 | |
| zircon | | | | | | | | | | | | | | | 5.0 | 7.0 | | |
| lead titanate | | | | 8 | | | | | | | | | | | | | | |

*references

TABLE 2

| Example No. | 1 | 2 | 3 | 4 | 5 | 6 | 7 | 8 | 9 | 10 | 11 | 12 | 13 | 14 | 15 | 16 | 17* | 18* |
|---|---|---|---|---|---|---|---|---|---|---|---|---|---|---|---|---|---|---|
| (Heating conditions and results of the tests) | | | | | | | | | | | | | | | | | | |
| Heating temp. (°C.) | 430 | 430 | 430 | 430 | 400 | 410 | 400 | 410 | 400 | 400 | 400 | 400 | 400 | 400 | 410 | 430 | 400 | |
| Heating period (min) | 10 | 10 | 10 | 10 | 10 | 10 | 10 | 10 | 10 | 10 | 10 | 10 | 10 | 10 | 10 | 10 | 10 | |
| Transformation point (°C.) | 314 | 315 | 314 | 308 | 305 | 302 | 295 | 305 | 300 | 305 | 294 | 293 | 295 | 296 | 298 | 315 | 311 | 311 |
| Softening point (°C.) | 355 | 358 | 352 | 348 | 340 | 340 | 338 | 346 | 338 | 346 | 336 | 335 | 338 | 340 | 342 | 355 | 350 | 350 |
| Coefficient of thermal expansion ($\times 10^{-7}$ °C.$^{-1}$) | 72 | 69 | 70 | 70.5 | 66 | 71 | 75 | 86 | 74 | 70 | 71 | 70 | 70 | 68 | 72 | 65 | 70 | 67 |
| Diameter of flow button (mm) | 23.0 | 21.6 | 22.5 | 21.3 | 16.5 | 16.4 | 15.7 | 23.2 | 18.8 | 18 | 19 | 20.0 | 22.0 | 21.5 | 21.0 | 23.0 | 14 | 15 |
| Volume resistivity log P(ohm · cm) | 11.5 | 11.3 | 11.1 | 11.5 | 12.0 | 11.8 | 10.7 | 11.2 | 11.1 | 12.1 | 11.9 | 12.0 | 11.0 | 11.5 | 12.2 | 12.0 | 11.6 | 11.9 |
| Dielectric constant | 17.5 | 15.0 | 15.2 | 21.2 | 16.0 | 14.4 | 17.3 | 16.5 | 15.2 | 12.3 | 12.2 | 12.5 | 12.3 | 15.5 | 16.5 | 17.2 | 12.3 | 12.4 |
| Corrosion resistant to: | | | | | | | | | | | | | | | | | | |
| 5% HNO$_3$ (mg/cm$^2$) | 94 | 43 | 91 | 75 | 46 | 58 | 89 | 57 | 62 | 60 | 71 | 60 | 45 | 75 | 55 | 60 | 120 | 125 |
| 20% CH$_3$COOH (mg/cm$^2$) | 103 | 51 | 104 | 84 | 52 | 63 | 98 | 66 | 69 | 62 | 79 | 65 | 51 | 82 | 62 | 72 | 138 | 144 |

*references

We claim:

1. In a sealing glass composition, used for sealing an alumina package containing a semiconductor integrated circuit, consisting essentially of low melting glass powder and refractory filler powder of low coefficient of thermal expansion, the improvement wherein said low melting glass has a composition consisting essentially of by weight %:

| | |
|---|---|
| PbO | 77.0–86.0 |
| B$_2$O$_3$ | 6.0–15.0 |
| ZnO | 0.5–6.9 |
| SiO$_2$ | 0.1–3.0 |
| Al$_2$O$_3$ | 0–3.0 |
| MgO, CaO, BaO, SrO | 0–2.0 |
| SnO$_2$ | 0–1.5 |
| Li$_2$O, Na$_2$O, K$_2$O | 0–1.0 | wherein said refractory filler is cordierite in a proportion of 2–30% by weight of the total composition and optionally, β-eucryptite, β-spodumene, lead titanate or zircon in a proportion, respectively, not exceeding 15% by weight of the total composition wherein said sealing glass composition can achieve a matched seal to a material having a thermal expansion coefficient of $65-70\times10^{-7}$ °C.$^{-1}$ (25°–400° C.) at a non-devitrified state by a heat-treatment at a temperature between 400° C. and 430° C. within a period of 10 minutes and wherein the weight loss of the composition, heat-treated at 400° to 430° C. for 10 minutes, is less than 100 mg/cm$^2$ when dipped in 5 wt. % nitric acid or 20 wt. % acetic acid for 10 minutes at 25° C.

2. The sealing glass composition claimed in claim 1, wherein said composition consists essentially of 75–97% by weight of said low melting glass and 3–25% by weight of cordierite.

3. The sealing glass composition claimed in claim 1, wherein said low melting glass has a composition consisting essentially of by weight %:

| | |
|---|---|
| PbO | 80.0–85.0% |
| B$_2$O$_3$ | 7.0–13.0% |
| ZnO | 2.5–6.5% |
| SiO$_2$ | 0.5–2.5% |
| Al$_2$O$_3$ | 0–3.0% |
| MgO, CaO, BaO, SrO | 0–2.0% |
| SnO$_2$ | 0 1.5% |
| Li$_2$O, K$_2$O, Na$_2$O | 0–1.0% |

4. The sealing glass composition claimed in claim 1, wherein said composition has a composition essentially of by weight of:

| | |
|---|---|
| PbO | 83.5–85.5% |
| B$_2$O$_3$ | 10.0–14.0% |
| ZnO | 1.5–3.0% |
| SiO$_2$ | 0.35–0.5% |
| Al$_2$O$_3$ | 0– 3.0% |
| MgO, CaO, BaO, SrO | 0–2.0% |
| SnO$_2$ | 0–1.5% |
| Li$_2$O, Na$_2$O, K$_2$O | 0–1.0% |

5. The sealing glass composition claimed in claim 1, wherein the coefficient of thermal expansion is $55-72\times10^{-7}$ °C.$^{-1}$ after heat-treatment at 400° to 430° C. for 10 minutes.

6. The sealing glass composition claimed in claim 1, wherein the diameter of the flow button is at least 17 cm after heat-treatment at 400° to 430° C. for 10 minutes.

7. The sealing glass composition claimed in claim 1, wherein the volume resistivity is at least $10^{10}$ ohm-cm at 150° C., after heat-treatment at 400° to 430° C. for 10 minutes.

8. The sealing glass composition claimed in claim 1, wherein the dielectric constant is less than 20 in a frequency of 1 MHz at 20° C., after heat-treatment at 400°–430° C. for 10 minutes.

9. The sealing glass composition claimed in claim 1, wherein the transformation point of the glass composition is 285° to 315° C. and the softening point of the glass composition is 335° to 360° C.

* * * * *